US007880382B2

(12) United States Patent
Nakamura

(10) Patent No.: US 7,880,382 B2
(45) Date of Patent: Feb. 1, 2011

(54) ORGANIC ELECTROLUMINESCENCE PANEL AND MANUFACTURING METHOD OF THE SAME

(75) Inventor: Akio Nakamura, Tokyo (JP)

(73) Assignee: Toppan Printing Co., Ltd. (JP)

(*) Notice: Subject to any disclaimer, the term of this patent is extended or adjusted under 35 U.S.C. 154(b) by 841 days.

(21) Appl. No.: 11/657,849

(22) Filed: Jan. 24, 2007

(65) Prior Publication Data
US 2007/0210702 A1 Sep. 13, 2007

(30) Foreign Application Priority Data

Mar. 8, 2006 (JP) ............... 2006-063214
Jun. 28, 2006 (JP) ............... 2006-177654

(51) Int. Cl.
H05B 33/04 (2006.01)

(52) U.S. Cl. ................. 313/512; 313/504

(58) Field of Classification Search ......... 313/498–512; 257/40, 72, 98–100, 642–643, 759; 315/169.1, 315/169.3; 427/58, 64, 66, 532–535, 539; 428/690–691, 917; 438/26–29, 34, 82; 445/24–25
See application file for complete search history.

(56) References Cited

U.S. PATENT DOCUMENTS

| | | | |
|---|---|---|---|
| 5,652,067 A | 7/1997 | Ito et al. | |
| 6,420,200 B1 | 7/2002 | Yamazaki et al. | |
| 6,582,504 B1 | 6/2003 | Fujita | |
| 6,605,826 B2* | 8/2003 | Yamazaki et al. | 257/72 |
| 2004/0021413 A1 | 2/2004 | Ito et al. | |
| 2004/0150319 A1* | 8/2004 | Tomimatsu et al. | 313/495 |
| 2005/0140290 A1* | 6/2005 | Park et al. | 313/512 |
| 2005/0189878 A1* | 9/2005 | Shitagami et al. | 313/512 |
| 2005/0285522 A1* | 12/2005 | Han et al. | 313/512 |

FOREIGN PATENT DOCUMENTS

| | | |
|---|---|---|
| JP | 05-078655 | 3/1993 |
| JP | 10-012377 | 1/1998 |
| JP | 10-077467 | 3/1998 |
| JP | 11-024604 | 1/1999 |
| JP | 2001-043980 | 2/2001 |

(Continued)

Primary Examiner—Nimeshkumar D Patel
Assistant Examiner—Donald L Raleigh
(74) Attorney, Agent, or Firm—Squire, Sanders & Dempsey L.L.P.

(57) ABSTRACT

An organic EL panel is provided which enables transparent sealing accompanied by low moisture permeability, and can be used also for sealing a top emission panel without deterioration for a long period of time even in the case of a panel having a narrow frame area. In an organic EL panel produced by covering the face of a supporting substrate 1, which is provided with an organic EL element 101, via an adhesive layer 8 by a sealing substrate 9 to permit sealing, a first partition 4 that protrudes toward the sealing substrate 9 is formed on one face of the supporting substrate 1 so as to surround the circumference of the organic EL element 101, and further, a second partition 10 that protrudes toward the supporting substrate 1 is formed on the face of the sealing substrate 9 opposing to the one face of the supporting substrate 1 so as to surround the circumference of the organic EL element 101.

19 Claims, 4 Drawing Sheets

FOREIGN PATENT DOCUMENTS

| | | |
|---|---|---|
| JP | 2001-076873 | 3/2001 |
| JP | 2001-093668 | 4/2001 |
| JP | 2001-155858 | 6/2001 |
| JP | 2001-155861 | 6/2001 |
| JP | 2001-185360 | 7/2001 |
| JP | 2001-291587 | 10/2001 |
| JP | 2002-100472 | 4/2002 |
| JP | 2002-305077 | 10/2002 |
| JP | 2002-313561 | 10/2002 |
| JP | 2003-059654 | 2/2003 |
| JP | 2003-059656 | 2/2003 |
| JP | 2003-243163 | 8/2003 |
| JP | 2003-282244 | 10/2003 |
| JP | 2004-055333 | 2/2004 |
| JP | 2004-063359 | 2/2004 |
| JP | 2004-095551 | 3/2004 |
| JP | 2004-355913 | 12/2004 |
| WO | WO 99/10862 | 4/1999 |

* cited by examiner

ORGANIC ELECTROLUMINESCENCE PANEL AND MANUFACTURING METHOD OF THE SAME

CROSS REFERENCE

This application claims priority to Japanese application number 2006-063214, filed on Mar. 8, 2006 and to Japanese application number 2006-177654, filed on Jun. 28, 2006, which are incorporated by reference.

BACKGROUND OF THE INVENTION

1. Field of the Invention

The present invention relates to an organic EL panel (organic electroluminescence panel) promising in broad applications as flat panel displays for use in televisions, personal computer monitors, hand held devices such as mobile phones, as well as surface emitting light sources, illuminations, emitting type advertisement bodies, and the like.

2. Description of the Related Art

Organic EL panels have been expected as flat panel displays which can replace cathode ray tubes and liquid crystal displays in light of advantages of wide viewing angle, high response speed, low electric power consumption and the like. Organic EL panels have a structure including an electrode for anode, an electrode for cathode and an organic light emitting medium layer arranged therebetween, and are self-emitting display devices which permit emission at the organic light emitting medium layer by applying voltage between the electrodes to allow an electric current to flow. In general, it is constructed such that a transparent electrode is used as the anode, and the light generated at the organic light emitting medium layer is extracted from the transparent anode side.

Furthermore, illustrative examples of driving system of the display include passive matrix driving and active matrix driving. In order for the display to have enlarged size and higher definition, active matrix driving in which display pixels that construct the display are driven by a TFT (thin film transistor) for every picture element is advantageous in terms of capability of driving at a low voltage. However, according to conventional-type bottom emission devices produced by forming the transparent anode on the TFT board to extract the light from the transparent anode side, there has been disadvantageous in that TFT, wiring and the like may limit the aperture ratio, thereby decreasing efficiency of extraction of the light.

To the contrary, so-called top emission panels have been recently developed in which a transparent electrode is used as the cathode, or the anode electrode and the cathode electrode are formed in the reverse order. Because the top emission panel can achieve greater aperture ratio as compared with conventional bottom emission panels, efficiency of extraction of the light is reported to be improved (for example, see Patent Document 1).

In such instances, cap sealing, which is a common sealing process of the bottom emission organic EL panels, using a glass cap or a metal cap having a recessed part is not applicable to the top emission panel because of internally included nontranslucent desiccant agent. Therefore, in recent years, solid sealing carried out by laminating a passivation film on the organic EL panel, followed by attaching a transparent substrate thereon via an adhesive was proposed (for example, see Patent Document 2).

However, according to the solid sealing method as described above, the desiccant agent cannot be included internally. Thus, film thinning, moisture permeability lowering and frame area widening of the adhesive layer as well as moisture permeability lowering of the passivation film shall be mandatory for suppressing penetration of water from the end face of the adhesive layer. Therefore, to attain a sealing performance that satisfies demands for narrowing of the frame area in recent years was difficult.

The invention was made in order to solve the aforementioned problems, and an object of the invention is to provide an organic EL panel which enables transparent sealing accompanied by low moisture permeability, and can be also used for sealing the top emission panel without deterioration for a long period of time even in the case of the panel having a narrow frame area.

Patent Document 1: JP-A-2001-43980
Patent Document 2: JP-A-2004-95551

SUMMARY OF THE INVENTION

An organic EL panel is provided which enables transparent sealing accompanied by low moisture permeability, and can be used also for sealing the top emission panel without deterioration for a long period of time even in the case of the panel having a narrow frame area. In an organic EL panel produced by covering the face of a supporting substrate 1, which is provided with an organic EL element 101, via an adhesive layer 8 by a sealing substrate 9 to permit sealing, a first partition 4 that protrudes toward the sealing substrate 9 is formed on one face of the supporting substrate 1 so as to surround the circumference of the organic EL element 101, and further, a second partition 10 that protrudes toward the supporting substrate 1 is formed on the face of the sealing substrate 9 opposing to the one face of the supporting substrate 1 so as to surround the circumference of the organic EL element 101.

DESCRIPTION OF REFERENCE NUMERALS AND SIGNS

100; organic EL panel, 101; organic EL element, 1; supporting substrate, 2; first electrode, 3; insulating layer, 4; first partition, 4a; recessed part, 5; organic light emitting medium layer, 6; second electrode, 7; barrier layer, 8; adhesive layer, 9; sealing substrate, 10; second partition, 10a; protruding part, 11; barrier layer, 12; electrode for extracting outside, 201; substrate, 202; anode layer, 203; box-like partition, 204; organic light emitting medium layer, 205; cathode layer, 206;

barrier layer, 207; adhesion layer, 208; sealing substrate, 209; projecting partition, 210; barrier layer.

BEST MODE FOR CARRYING OUT THE INVENTION

First Embodiment

Figure 1:
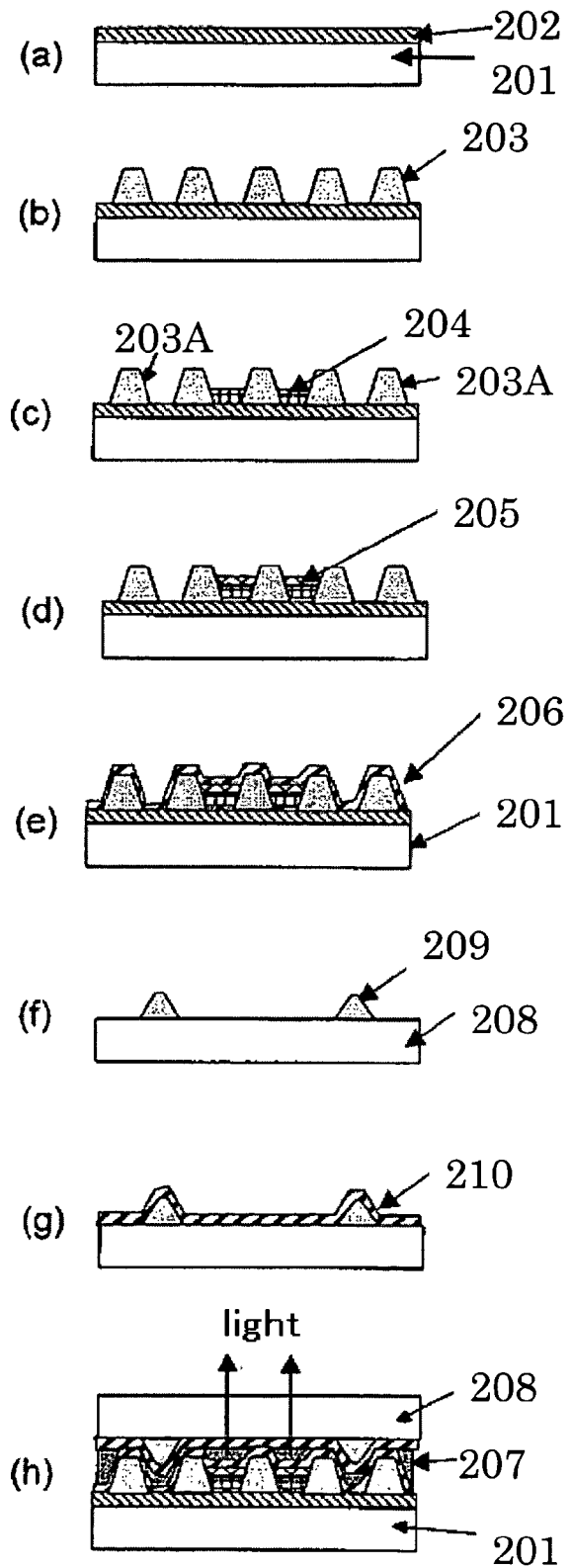
FIG. 1 shows explanatory views illustrating one embodiment of a method of manufacturing an organic EL panel of the present invention.

One embodiment of the organic electroluminescence panel (hereinafter, referred to as "organic EL panel") and a method of manufacturing the same according to the present invention will be described below. FIG. 1 shows explanatory views illustrating one embodiment of the method of manufacturing the organic EL panel of the invention. With respect to a top emission panel, an electrode layer on the top emission side may be either anode or cathode as long as at least one of the anode and the cathode is translucent.

Material for a substrate 201 (board) is preferably selected depending on the direction of extracting the luminescence. For example, when extraction of the light is intended, glass; quartz; a film or sheet of a plastic such as polypropylene, polyether sulfone, polycarbonate, cycloolefin polymer, polyarylate, polyamide, polymethyl methacrylate, polyethylene terephthalate or polyethylene naphthalate; or a transparent substrate produced by laminating inorganic oxide such as silicon oxide or aluminum oxide, inorganic fluoride such as aluminum fluoride or magnesium fluoride, inorganic nitride such as silicon nitride or aluminum nitride, inorganic oxynitride such as silicon oxynitride, or a film of a polymer resin such as an acrylic resin, an epoxy resin, a silicone resin or a polyester resin to form a monolayer or multilayers on the aforementioned plastic film or sheet may be used. When extraction of the light is not intended, in addition to the foregoing transparent substrate, a foil or sheet of a metal such as aluminum or stainless, a silicon board, a nontransparent substrate produced by laminating a film of a metal such as aluminum, copper, nickel or stainless on the aforementioned plastic film or sheet, or the like may be used.

Also, the substrate 201 may have a thin film transistor (TFT) formed thereon as needed, and may be used as a board for driving. As the thin film transistor, any known thin film transistor can be used. Specific examples thereof include thin film transistors predominantly constructed from an active layer on which a source/drain region and a channel region are formed, a gate insulating film and a gate electrode. Structure of the thin film transistor is not particularly limited, but for example, staggered type, inversely staggered type, top gate type, coplanar type or the like may be exemplified. The active layer is not particularly limited, but can be formed with, for example, an inorganic semiconductor material such as amorphous silicon, polycrystalline silicon, microcrystalline silicon or cadmium selenide, or an organic semiconductor material such as a thiophene oligomer or poly(p-phenylenevinylene). The active layer may be formed by, for example, a method which comprises laminating amorphous silicon by a plasma CVD method and subjecting to ion doping; a method which comprises forming amorphous silicon by an LPCVD method using a SiH$_4$ gas, obtaining polysilicon through crystallization of the amorphous silicon by a solid phase growth process, followed by subjecting to ion doping by an ion implantation process; a method which comprises forming amorphous silicon by an LPCVD method using a Si$_2$H$_6$ gas or by a PECVD method using a SiH$_4$ gas, annealing with a laser such as excimer laser, crystallizing the amorphous silicon to obtain polysilicon, followed by subjecting to ion doping by an ion doping process (low temperature process); a method which comprises laminating polysilicon by a low pressure CVD method or an LPCVD method, thermal oxidation at 1000° C. or higher to form the gate insulating film, forming the gate electrode of n+polysilicon thereon, followed by subjecting to ion doping by an ion implantation process (high temperature process); or the like. As the gate insulating film, one which has been generally used as the gate insulating film can be used, and for example, SiO$_2$ formed by a PECVD method or an LPCVD method; SiO$_2$ obtained by subjecting a polysilicon film to thermal oxidation; or the like may be used. As the gate electrode, one which has been generally used as the gate electrode can be used, and examples thereof include metals such as aluminum and copper; high melting point metals such as titanium, tantalum and tungsten; polysilicon; silicide and polycide of a high melting point metal; and the like. Also, the thin film transistor may have a single gate structure, a double gate structure, or a multi gate structure having three or more gate electrodes. In addition, it may also have an LDD structure or an offset structure. Moreover, two or more thin film transistors may be disposed in one picture element.

According to the organic EL element of this embodiment, the thin film transistor must be connected so as to function as a switching element of the organic EL element, and the drain electrode of the transistor is electrically connected to the first electrode of the organic EL element. The connection of the thin film transistor and the drain electrode and the first electrode of the organic EL element may be perfected via a connection wire formed in the contact hole that penetrates a planarization film.

First, an anode layer 202 is provided on the substrate 201 (FIG. 1(a)). In this process, the material of the anode layer 202 is not particularly limited as long as it is a material having low resistance and does not deteriorate the positive hole injection property into the organic light emitting medium layer. A transmissive organic EL element may be obtained using a transmissive film including a metal oxide or the like, alternatively, a top emission organic EL element may be obtained using a nontransmissive film including a metal material. The material of the electrode which can be used is any one of: metal oxides such as indium oxide and tin oxide; metal complex oxides such as ITO (indium-tin complex oxide), indium-zinc complex oxide and zinc-aluminum complex oxide; metal materials such as gold and platinum; and fine grain dispersion films produced by dispersing fine grains of such a metal oxide or a metal material in an epoxy resin or an acrylic resin and laminating the dispersion to form a monolayer or multilayers. In addition, for reducing the wiring resistance of the anode layer 202 as needed, a metal material such as copper or aluminum may be placed in conjunction as an auxiliary electrode. The method of forming the anode layer 202 which can be employed may be, depending on the material, a dry film formation method such as a resistance heating vapor deposition method, an electron beam-vapor deposition method, a reactive deposition method, an ion plating method or a sputtering method, a wet film formation method such as a gravure printing method or a screen printing method, or the like. The method of patterning the anode layer 202 which can be employed may be, depending on the material and the method of the film formation, a known patterning method such as a mask vapor deposition method, a photolithography method, a wet etching method or a dry etching method.

The anode layer is formed in stripes when the driving method of the organic EL element is based on a passive matrix, while it is formed in dots when the driving method is based on an active matrix in which the TFT board is used.

Next, after forming the anode layer 202, a box-like partition 203 is formed such that the anode edge is covered (FIG.

Figure 2:
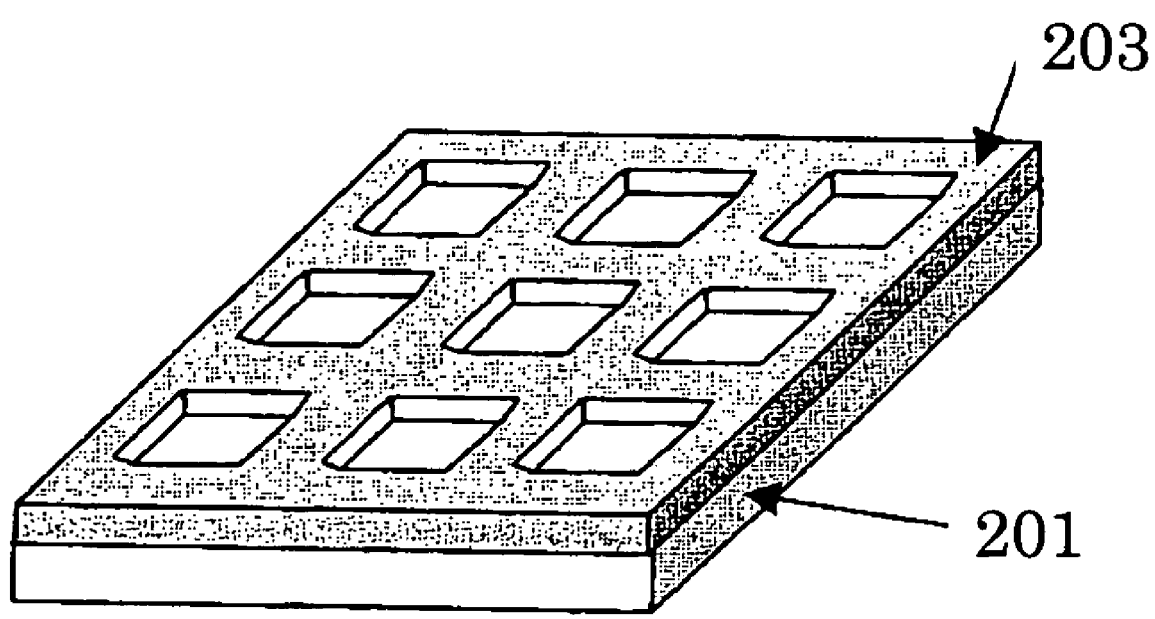
FIG. 2 shows a conceptual diagram illustrating a box-like partition in the organic EL panel according to one embodiment of the invention.

1(b)). FIG. 2 shows conceptual diagrams illustrating the box-like partition 203. The box-like partition 203 must have an insulation property, and a photosensitive material or the like can be used. The photosensitive material may be either a positive type or a negative type, and a photoradical polymerizing or photocation polymerizing photohardening resin, or a copolymer containing an acrylonitrile component, polyvinyl phenol, polyvinyl alcohol, a novolak resin, a polyimide resin, as well as cyanoethyl pullulan, $SiO_2$, $TiO_2$, or the like can be used. When the material for forming the partition is a photosensitive material, the patterning is executed by a photolithography method which may involve exposure and development after coating the solution of the material for formation on the entire face by a slit coating method or a spin coating method. Also, the pattern may be formed using an intaglio printing method, a letterpress printing method, or a lithographic printing method. In addition, when the material for forming the partition is either $SiO_2$ or $TiO_2$, formation is enabled by a dry film formation method such as a sputtering method or a CVD method, while the patterning of the partition can be carried out by a masking or photolithography method.

Particularly, the box-like partition 203 used in this embodiment preferably has a taper shape for achieving more favorable coating film formation capability of the barrier layer 206 described later, and preferably has a shape of the opening of the top and bottom face being a shape without angulated portion such as circular, elliptical or round corner square. Also, side wall lateral face of the box-like partition preferably has a shape without angulated portion. The arrangement of each box-like partition can be selected ad libitum from arrangement patterns as needed, which may be any one of a lattice arrangement and a delta arrangement. Also, the box-like partition 203 may be either water-repellent or hydrophilic depending on the film formation method of the organic light emitting medium layer 204 described later. In addition, the thickness of the box-like partition 203 is not particularly limited but may be approximately 0.1 μm to 50 μm which is to be optionally employed. In this embodiment, the thickness of the box-like partition 203 is more desirably equal to or less than the thickness of the adhesion layer 207 described later. Still further, for facilitating superposition of the box-like partition 203 and the projecting partition 209 formed on the sealing substrate 208 described later, it is preferred that at least the box-like partition located at a diagonal part of the outermost periphery among the box-like partitions 203 can be used as an alignment mark. Furthermore, depending on the accuracy of the alignment, it is more preferred to optionally give the alignment mark shape such as a crisscross mark, a #-shaped mark or the like.

Next, the organic light emitting medium layer 204 is formed inside of the box-like partition 203 (FIG. 1(c)). However, the organic light emitting medium layer 204 is not formed in at least outermost peripheral box-like partition 203. Accordingly, the organic electroluminescence element is not formed in at least the box-like partitions 203 located at an outermost periphery among multiple box-like partitions 203, and the outermost peripheral box-like partition group 203A is constructed with the box-like partition 203 located at an outermost periphery without having the organic electroluminescence element formed therein.

The organic light emitting medium layer 204 according to this embodiment can be formed as a monolayer film or a multilayer film containing a luminescent material. Examples of the construction in which it is formed as the multilayer film include: a bilayer construction including a positive hole transport layer and an electron transporting luminescent layer, or a positive hole transporting luminescent layer and an electron transport layer; and a triplelayer construction including a positive hole transport layer, a luminescent layer and an electron transport layer. Still more preferably, further more layers may be formed by separating the positive hole (electron) injection function and the positive hole (electron) transport function as needed, or by inserting a layer which blocks the transport of the positive hole (electron) or the like.

Subsequently, the cathode layer 205 is formed on the organic light emitting medium layer 204 (FIG. 1(d)). As the material of the cathode layer 205, an elemental metal such as Mg, Al or Yb may be used. Alternatively, Al or Cu having excellent stability and electric conductivity may be laminated on the boundary being in contact with the optical gain medium so that a compound such as Li, Li oxide or LiF is interposed to give a thickness of 1 nm. Alternatively, for the purpose of achieving both electron injection efficiency and stability, an alloy of one or more metals having a low work function such as Li, Mg, Ca, Sr, La, Ce, Er, Eu, Sc, Y or Yb with a stable metal element such as Ag, Al or Cu may be also used. Specifically, an alloy such as MgAg, AlLi or CuLi can be used. Still more, Li or Cs having a low work function can be doped in a small amount in the organic light emitting medium layer 204. Additionally, in the case of use as a translucent electrode layer for injecting the electron, Li or Ca having a low work function may be provided to give a thin film, and thereafter, a metal complex oxide such as ITO (indium-tin complex oxide), indium-zinc complex oxide or zinc-aluminum complex oxide may be laminated, or after doping the metal having a low work function such as Li or Ca in a small amount in the organic light emitting medium layer 204, the metal oxide such as ITO may be laminated. The method of forming the cathode layer 205 which can be employed may be, depending on the material, a resistance heating vapor deposition method, an electron beam-vapor deposition method, a reactive deposition method, an ion plating method, or a sputtering method. Although the thickness of the cathode is not particularly limited, it is desirably approximately 10 nm to 1000 nm. In addition, in the case of use as a translucent electrode layer for injecting the electron, when the metal material such as Ca or Li is used, the film thickness is desirably approximately 0.1 to 10 nm.

The cathode layer is formed in stripes so that the stripes are perpendicular to the anode layer formed to have a pattern in the stripes when the driving system of the organic EL element is based on a passive matrix. When the driving system is based on an active matrix, the cathode layer may be formed on the entire face of the organic EL panel. The cathode layer may be formed on the partition top face.

By thus forming the cathode layer 205, the box-like partition board is constructed from the box-like partitions 203 in which the organic electroluminescence element was formed, the box-like partitions 203 that construct the outermost peripheral box-like partition group 203A, and the board 201.

Next, the barrier layer 206 is laminated so as to cover the cathode layer 205 and the box-like partition 203 at the outermost periphery (FIG. 1(e)). As the barrier layer 206, inorganic oxide such as silicon oxide or aluminum oxide, inorganic fluoride such as aluminum fluoride or magnesium fluoride, an inorganic nitride such as silicon nitride, aluminum nitride or carbon nitride, inorganic oxynitride such as silicon oxynitride, inorganic carbide such as silicon carbide, or the like can be used. Particularly, it is preferred that silicon nitride, silicon oxide or silicon oxynitride that is excellent in the barrier property be used. Also, as the barrier layer 206, a laminated film with a film of a polymer resin such as an acrylic resin, an epoxy resin, a silicone resin or a polyester resin can be used as needed. Furthermore, when the light is not extracted from the top side, a film of a metal such as aluminum, titanium or gold maybe laminated. The method of forming the barrier layer 206 which can be employed may be, depending on the material, a resistance heating vapor deposition method, an electron beam-vapor deposition method, a reactive deposition method, an ion plating method, a sputtering method or a CVD method. In particular, a CVD method is preferably used in light of the barrier property, translucency and step coverage. Examples of the CVD method which can be used include thermal CVD methods, plasma CVD methods, catalyst CVD methods, VUV-CVD methods and the like. Furthermore, with respect to the reactant gas in the CVD method, a gas such as $N_2$, $O_2$, $NH_3$, $H_2$ or $N_2O$ may be added as needed to an organic silicon compound such as monosilane, hexamethyl disilazane (HMDS) or tetraethoxysilane. In addition, in the above described film, hydrogen or carbon may be included depending on the used reactive gas. The film thickness of the barrier layer 206 may vary depending on electrode step height of the organic EL element, partition height of the board, required barrier characteristics and the like, but may be preferably approximately 10 nm to 10000 nm, and more preferably, approximately 100 nm to 1000 nm. Furthermore, when the barrier layer 206 has a great residual stress of the film, film detachment in the organic EL element may be caused. Therefore, it is preferred that a low density film of at least ±100 MPa or less is provided.

Next, prior to laminating the sealing substrate 208 via the adhesive layer 207, projecting partitions 209 and a barrier layer 210 are provided on the sealing substrate 208 (FIGS. 1(f), (g)) The projecting partition 209 is formed at substantially the same position as the opening of the box-like partitions 203 that construct the outermost peripheral box-like partition group 203A. Thus, concurrently with attaching the substrate 201 and the sealing substrate 208, the box-like partitions 203 that construct the outermost peripheral box-like partition group 203A and the projecting partitions 209 are superposed at their recesses and protrusions. Therefore, the route through which the moisture penetrated from the end passes to reach the organic EL element can be readily lengthened, whereby the organic EL panel which is not accompanied by deterioration for a long period of time can be produced even in the case of the panel having a narrow frame area. In addition, by reducing the size of each projecting partition 209 to be smaller than the size of substantially the same shape as the opening of the box-like partition 203, the projecting partition 209 can be prevented from bringing into contact with the organic EL element when the box-like partitions 203 that construct the outermost peripheral box-like partition group 203A are superposed on the projecting partitions 209.

As the material of the projecting partition 209 and the barrier layer 210, similar material to that of the aforementioned box-like partition 203 and barrier layer 206 can be used. For achieving more favorable coating film formation capability of the barrier layer 210, it is preferred that the projecting partition 209 has a tapered cross-sectional shape. The projecting partition 209 is different from the box-like partition 203 in terms of the shape of the partition. More specifically, the projecting partition 209 has a projecting shape which is a reversal shape of the box-like partition 203, and preferably has itself a shape without angulated portion such as circular, elliptical or round corner square. It is desired that the arrangement of the projecting partitions essentially follows the pattern on the outermost peripheral box-like partition 203, however, to meet with the demanded moisture resistance performance, it is more preferred to increase the number of the rows of the recesses and protrusions to be superposed because penetration route of the moisture can be further lengthened. In addition, a nonlinear arrangement such as a delta arrangement can be more suitably used than a linear arrangement because the penetration route can be lengthened.

Next, the sealing substrate 208 having the projecting partition 209 and barrier layer 210 formed therein is laminated on the substrate 201 via the adhesive layer 207 (FIG. 1(h)).

Examples of the material of the adhesive layer 207 which can be used include thermal cure adhesive resins, UV-cure adhesive resins including an epoxy resin, an acrylic resin, a silicone resin or the like, as well as thermoplastic adhesive resins including an acid-modified product of polyethylene, polypropylene or the like. The method of forming the adhesive layer 7 which can be employed may be, depending on the material and the pattern, a coating method or a printing method such as spin coating, spray coating, flexo, gravure, microgravure or intaglio offset as well as a ink jet method, a transfer method, a laminating method or the like. Although the thickness of the adhesive layer 207 is not particularly limited, it is preferably approximately 5 to 50 μm because amount of transmission of the moisture can be minimized as the thickness is smaller, and still further, it is more preferably at least not less than the height of the box-like partition 203 for achieving uniform attaching of the box-like partition 203 and the projecting partition 209 without any gap.

As the material of the sealing substrate 208, similarly to the aforementioned substrate 201, optimal substrate may be desirably selected depending on the direction of extracting the light. Examples of the material which can be used include glass, quartz, barrier films, metal foils and the like.

Second Embodiment

Next, an embodiment of the organic EL panel according to the invention will be explained with reference to the drawings. The organic EL panel according to the invention is not limited to the embodiment described below.

Moreover, with respect to the top emission panel in the invention, the electrode layer on the top emission side may be either an anode or a cathode as long as at least one of the anode and the cathode is translucent. Hereinafter, one example of the top emission organic EL panel according to the invention will be explained with reference to FIG. 3.

The organic EL panel 100 has, as shown in FIG. 3(h), a planar supporting substrate 1, and an organic EL element 101 provided on one face of this supporting substrate 1. The organic EL element 101 has: numerous first electrodes 2 formed to give a matrix arrangement to correspond to display pixels on one face of the supporting substrate 1; an organic light emitting medium layer 5 laminated every first electrode 2 on the open top face of the first electrode 2 surrounded by an insulating layer 3; and a second electrode 6 laminated on the insulating layer 3 and the organic light emitting medium layer 5, wherein the one face of the supporting substrate 1 including this organic EL element 101 is covered by a sealing substrate 9 via an adhesive layer 8 thereby being sealed.

For securing the water tightness of the lateral circumferential face of the adhesive layer 8 for attaching the supporting substrate 1 and the sealing substrate 9, a first partition 4 that protrudes toward the sealing substrate 9 is formed on the marginal site of one face of the supporting substrate 1 so as to surround the circumference of the organic EL element 101, and further, a second partition 10 that protrudes toward the supporting substrate 1 is formed on the marginal site of the sealing substrate 9 on the face opposing to the one face of the supporting substrate 1 so as to surround the circumference of the organic EL element 101. Additionally, an electrode for extracting outside 12 of the second electrode 6 is formed on the marginal site of the one face of the supporting substrate 1, and this electrode for extracting outside 12 is provided to locate to underly the first partition 4. Also, in FIG. 3(*e*), the reference numeral 7 represents a barrier layer that covers the surface of the organic EL element 101 and the surface of the first partition 4, and the reference numeral 11 represents a barrier layer that covers the surface of the second partition 10 and the surface of the sealing substrate 9.

Figure 3:
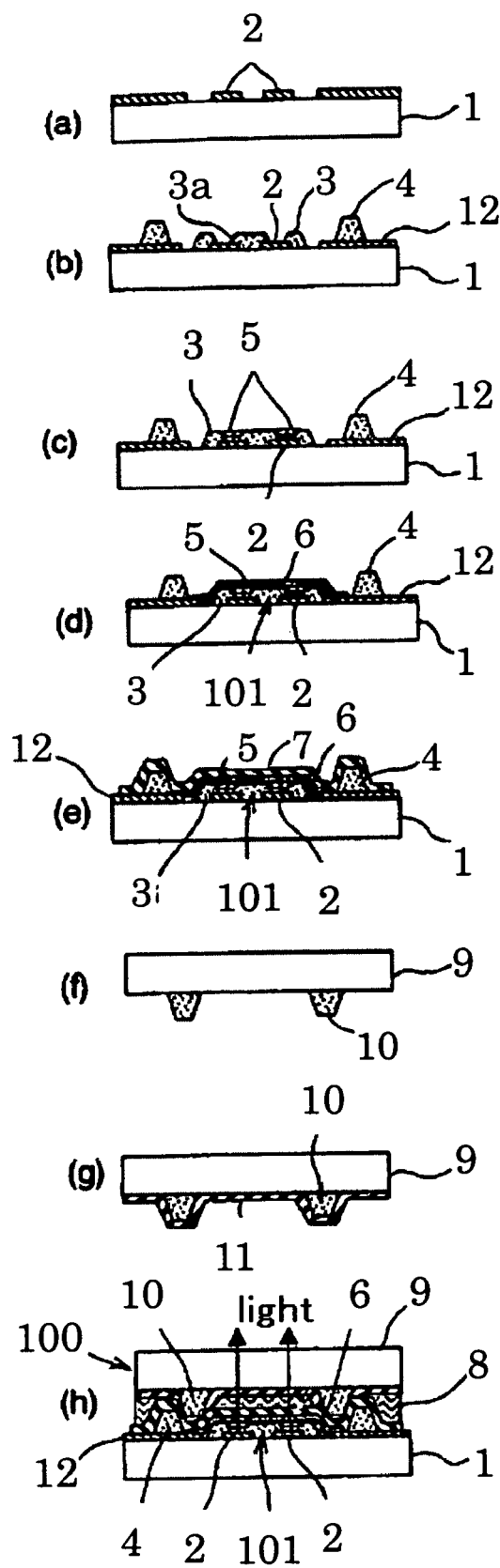
FIGS. 3(a) to 3(h) show explanatory cross-sectional views illustrating one example of the method of manufacturing the organic EL panel of the invention.

Although not shown in FIG. 3(*h*), a TFT (thin film transistor) for driving the organic EL element 101 is disposed in the region of the supporting substrate 1 opposing to the organic EL element 101.

The material used for the supporting substrate 1 is preferably selected depending on the direction of extracting the light in the organic EL panel. For example, when extraction of the light is intended, glass; quartz; a film or sheet of a plastic such as polypropylene, polyether sulfone, polycarbonate, cycloolefin polymer, polyarylate, polyamide, polymethyl methacrylate, polyethylene terephthalate or polyethylene naphthalate; or a transparent substrate produced by laminating metal oxide such as silicon oxide or aluminum oxide, metal fluoride such as aluminum fluoride or magnesium fluoride, metal nitride such as silicon nitride or aluminum nitride, metal oxynitride such as silicon oxynitride, or a film of a polymer resin such as an acrylic resin, an epoxy resin, a silicone resin or a polyester resin to form a monolayer or multilayers on the aforementioned plastic film or sheet may be used for the supporting substrate 1. Moreover, when extraction of the light is not intended, in addition to the foregoing transparent substrate, a foil or sheet of a metal such as aluminum or stainless, a silicon board, a nontransparent substrate produced by laminating a film of a metal such as aluminum, copper, nickel or stainless on the aforementioned plastic film or sheet, or the like may be used.

Also, the supporting substrate 1 may have a thin film transistor (TFT) formed thereon as needed, and may be used as a board for driving. As the thin film transistor, any known thin film transistor can be used. Specific examples thereof include thin film transistors predominantly constructed from an active layer on which a source/drain region and channel region are formed, a gate insulating film, and a gate electrode. Structure of the thin film transistor is not particularly limited, but for example, staggered type, inversely staggered type, top gate type, coplanar type or the like may be exemplified. The active layer is not particularly limited, but can be formed with, for example, an inorganic semiconductor material such as amorphous silicon, polycrystalline silicon, microcrystalline silicon or cadmium selenide, or an organic semiconductor material such as a thiophene oligomer or poly(p-phenylenevinylene). The active layer may be formed by, for example, a method which comprises laminating amorphous silicon by a plasma CVD method and subjecting to ion doping; a method which comprises forming amorphous silicon by an LPCVD method using a $SiH_4$ gas, obtaining polysilicon through crystallization of the amorphous silicon by a solid phase growth process, followed by subjecting to ion doping by an ion implantation process; a method which comprises forming amorphous silicon by an LPCVD method using a $Si_2H_6$ gas or by a PECVD method using a $SiH_4$ gas, annealing with a laser such as excimer laser, crystallizing the amorphous silicon to obtain polysilicon, followed by subjecting to ion doping by an ion doping process (low temperature process); a method which comprises laminating polysilicon by a low pressure CVD method or an LPCVD method, thermal oxidation at 1000° C. or higher to form the gate insulating film, forming the gate electrode of n+ polysilicon thereon, followed by subjecting to ion doping by an ion implantation process (high temperature process); or the like. As the gate insulating film, one which has been generally used as the gate insulating film can be used, and for example, $SiO_2$ formed by a PECVD method or an LPCVD method; $SiO_2$ obtained by subjecting a polysilicon film to thermal oxidation; or the like may be used. As the gate electrode, one which has been generally used as the gate electrode can be used, and examples thereof include metals such as aluminum and copper; high melting point metals such as titanium, tantalum and tungsten; polysilicon; silicide and polycide of a high melting point metal; and the like. Also, the thin film transistor may have a single gate structure, a double gate structure, or a multi gate structure having three or more gate electrodes. In addition, it may also have an LDD structure or an offset structure. Moreover, two or more thin film transistors may be disposed in one picture element.

According to the organic EL element of the invention, the thin film transistor must be connected so as to function as a switching element of the organic EL element, and the drain electrode of the transistor is electrically connected to the first electrode of the organic EL element. The connection of the thin film transistor and the drain electrode and the first electrode of the organic EL element may be carried out via a connection wire formed in the contact hole that penetrates in the planarized film.

Figure 4:
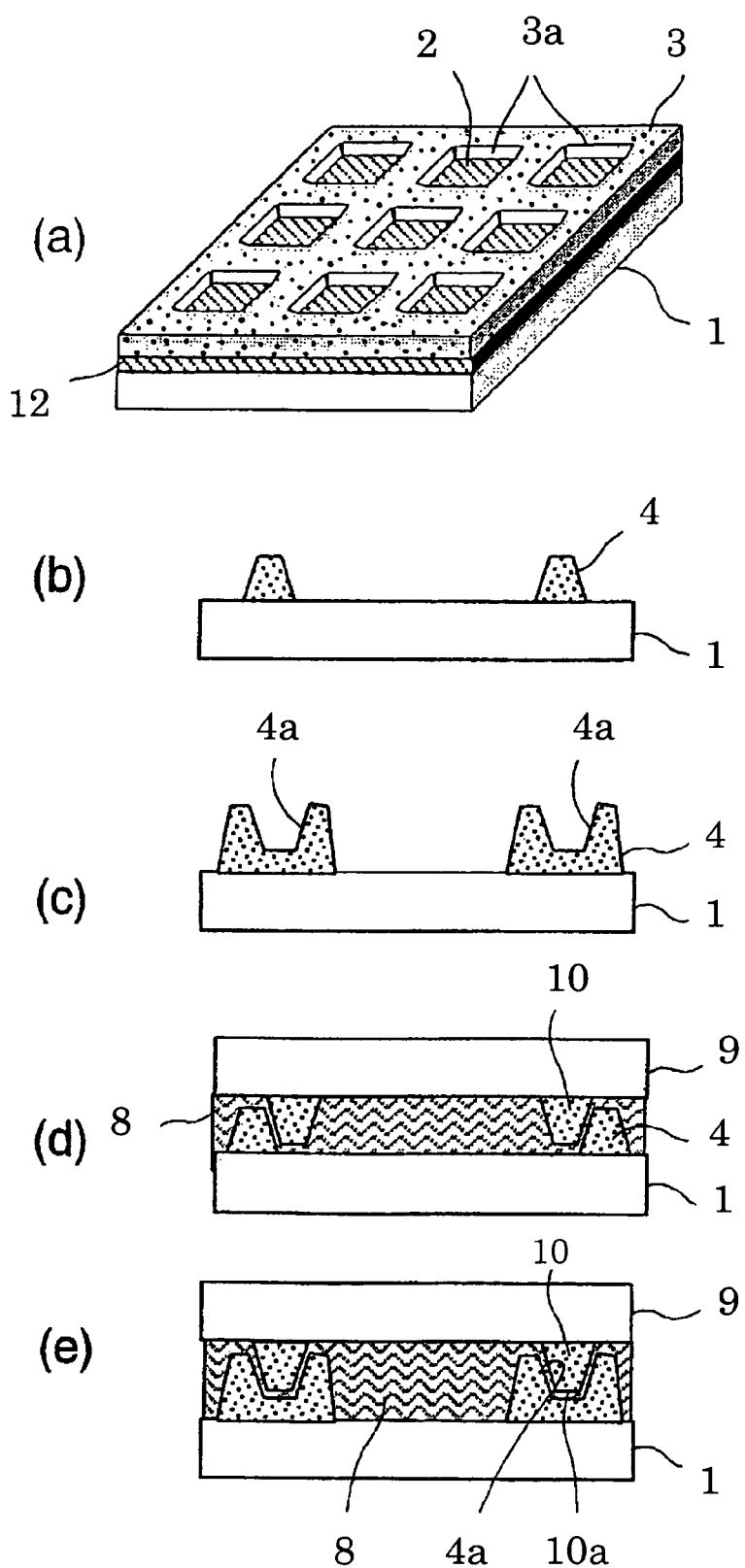
FIGS. 4(a) to 4(e) show explanatory views illustrating an example of the shapes of an insulating layer and first, second partitions according to this embodiment, and an example of superposition of the first partition and the second partition.

Next, the method of manufacturing the organic EL panel according to this embodiment will be explained with reference to FIG. 3 and FIG. 4.

First, as shown in FIG. 3(*a*), the first electrode 2 as an anode is formed on the top face of the supporting substrate 1. Concurrently with the formation of the first electrode 2, the electrode for extracting outside 12 of the second electrode 6 shown in FIG. 3 is formed on the marginal site of the supporting substrate 1.

The material of the first electrode 2 is not particularly limited as long as it is a material having low resistance and does not deteriorate the positive hole injection property into the organic light emitting medium layer 5. A transmissive film including a metal oxide or the like may be used to form a transmissive organic EL element or a nontransmissive film including a metal material may be used to form a top emission organic EL element. The material which can be used is any one of: metal oxides such as indium oxide and tin oxide; metal complex oxides such as ITO (indium-tin complex oxide), indium-zinc complex oxide and zinc-aluminum complex oxide; metal materials such as gold and platinum; and fine grain dispersion films produced by dispersing fine grains of such a metal oxide or a metal material in an epoxy resin or an acrylic resin and laminating the dispersion to form a monolayer or multilayers. In addition, for reducing the wiring resistance of the first electrode 2 as needed, a metal material such as copper or aluminum may be placed in conjunction as an auxiliary electrode. The method of forming the first electrode 2 which can be employed may be, depending on the material to be used, a dry film formation method such as a resistance heating vapor deposition method, an electron beam-vapor deposition method, a reactive deposition method, an ion plating method or a sputtering method, a wet film formation method such as a gravure printing method or a screen printing method, or the like. The method of patterning the first electrode 2 which can be employed may be, depending on the material and the method of the film formation, a known patterning method such as a mask vapor deposition method, a photolithography method, a wet etching method or a dry etching method.

Next, as shown in FIG. 3(b), the insulating layer 3 is formed into a box-like shape on the supporting substrate 1 so that the circumference of the first electrode 2 is covered, and multiple organic EL elements 101 are defined. The overall shape of this insulating layer 3 exhibits, as shown in FIG. 4(a), a lattice shape having an opening 3a, with the part opposing to the first electrode 2 being opened.

Furthermore, as shown in FIG. 3(b), the first partition 4 is formed in a state to be laminated on the electrode for extracting outside 12, on the surface of the marginal site of the supporting substrate 1 located outside the organic EL element 101 and further outside the second partition 10 provided on the sealing substrate 9. This first partition 4 exhibits, as shown in FIG. 3 and FIG. 4(b), a taper shape in which the cross sectional area is decreased from the basal part joining with the supporting substrate 1 toward the tip. Furthermore, the first partition 4 is constructed to have a frame-like shape without any angulated portion when viewed from the protruding tip side, in other words, to have a shape exhibiting an endless frame-like shape with the corner portions of the first partition 4 curved in a circular arc shape, corresponding to the four corners of the supporting substrate 1 that exhibits a rectangular shape.

The first partition 4 in the invention is not limited to the one having the protruding shape shown in FIG. 3 and FIG. 4(b), but may have a structure including the recessed part 4a formed over the entire length of the protruding tip face of the first partition 4 as shown in FIG. 4(c), and may further have a structure including a protruding part 10a formed on the protruding tip face of the second partition 10 provided on the sealing substrate 9 so as to engage with the recessed part 4a of the first partition 4 as shown in FIG. 4(e). Also, a structure in which the first partitions 4 are provided in multiple rows in the direction of the plane of the supporting substrate 1 is permitted.

In the insulating layer 3 and the first partition 4, a material having an electrical insulation property must be used, and for example, a photosensitive material or the like can be used. The photosensitive material may be either a positive type or a negative type, and a photoradical polymerizing or photocation polymerizing photohardening resin, or a copolymer containing an acrylonitrile component, polyvinyl phenol, polyvinyl alcohol, a novolak resin, a polyimide resin, as well as cyanoethyl pullulan, $SiO_2$, $TiO_2$, or the like can be used.

When the material for forming the partition is a photosensitive material, the patterning is executed by a photolithography method which may involve exposure and development after coating the solution of the material for formation on the entire face by a slit coating method or a spin coating method. Also, the pattern may be formed using an intaglio printing method, a letterpress printing method, or a lithographic printing method. In addition, when the material for forming the partition is either $SiO_2$ or $TiO_2$, the partition formation is enabled by a dry film formation method such as a sputtering method or a CVD method, while the patterning of the partition can be carried out by a masking or photolithography method.

Particularly, the insulating layer 3 and the first partition 4 in this embodiment preferably have a taper shape in which the cross sectional area is decreased in a direction toward the protruding tip for achieving more favorable coating film formation capability of the barrier layer 7 described later. Furthermore, the shape of the opening 3a of the insulating layer 3 formed on the supporting substrate 1 so as to cover the circumference of each first electrode 2 is not limited to a round corner square as shown in FIG. 4(a), but may be a shape without having any angulated portion such as circular, elliptical or the like. Similarly, it is preferred that the side wall of the insulating layer 3 and the first partition 4 be also a face having no angulated portion, and being inclined.

Further, although the shape of the insulating layer 3 is determined based on the arrangement pattern of the first electrode 2, it can be selected ad libitum from arrangement patterns as needed, which may be any one of a lattice arrangement as shown in FIG. 4(a), or a delta arrangement. Also, the insulating layer 3 may be either water-repellent or hydrophilic depending on the film formation method of the organic light emitting medium layer 5. In addition, the thickness of the insulating layer 3 is not particularly limited but one having the thickness of approximately 0.1 μm to 50 μm may be optionally used. In particular, the thickness is more desirably not greater than half the thickness of the adhesive layer 8.

Moreover, the size of the protruding height of the first partition 4 is not particularly limited, but one having the size of approximately 0.1 to 50 μm may be optionally used. However, it is preferred that the size of the protruding height of the first partition 4 be greater than the size of the protruding height of the insulating layer 3 and not smaller than half the thickness of the adhesive layer 8 for achieving long life of the organic EL panel through allowing the protruding tip parts of the first partition 4 and the second partition 10 to overlap each other in the protruding direction as shown in FIG. 4(d), and allowing the supporting substrate 1 and the sealing substrate 9 to be adjacent one another in the direction of the plane. Also, for positioning the first partition 4 in adjacent to the second partition 10 formed on the sealing substrate 9, an alignment mark is preferably formed as needed, and depending on the accuracy of the alignment, an alignment mark shape such as a crisscross mark, a #-shaped mark or the like may be employed ad libitum.

Next, as shown in FIG. 3(c), the organic light emitting medium layer 5 is formed on the first electrode 2 facing the opening 3a of the insulating layer 3.

The organic light emitting medium layer 5 according to this embodiment can be formed as a monolayer film or a multilayer film containing a luminescent material. Examples of the construction in which it is formed as the multilayer film include: a bilayer structures including a positive hole transport layer and an electron transporting luminescent layer or a positive hole transporting luminescent layer and an electron transport layer; and a triplelayer structures including a positive hole transport layer, a luminescent layer and an electron transport layer. Still more preferably, further more layers may be formed by separating the positive hole (electron) injection function and the positive hole (electron) transport function as needed, or by inserting a layer which blocks the transport of the positive hole (electron) or the like.

Examples of the positive hole transport material can be selected from among metal phthalocyanines such as copper phthalocyanine and tetra (t-butyl) copper phthalocyanine, nonmetal phthalocyanines, quinacridone compounds, aromatic amine-based low-molecular positive hole injection transport materials such as 1,1-bis(4-di-p-tolylaminophenyl) cyclohexane, N,N'-diphenyl-N,N'-bis(3-methylphenyl)-1,1'-biphenyl-4,4'-dia mine and N,N'-di(1-naphthyl)-N,N'-diphenyl-1,1'-biphenyl-4,4'-diamine, high-molecular positive hole transport materials such as polyaniline, polythiophene, polyvinylcarbazole and mixtures of poly(3,4-ethylenedioxythiophene) with polystyrenesulfonic acid, polythiophene oligomer materials, and other existing positive hole transport materials.

Examples of the luminescent material which can be used include low-molecular luminescent materials such as 9,10-diarylanthracene derivatives, pyrene, coronene, perylene, rubrene, 1,1,4,4-tetraphenylbutadiene, tris(8-quinolinolate) aluminum complexes, tris(4-methyl-8-quinolinolate)aluminum complexes, bis(8-quinolinolate)zinc complexes, tris(4-methyl-5-trifluoromethyl-8-quinolinolate)aluminum complexes, tris(4-methyl-5-cyano-8-quinolinolate)aluminum complexes, bis(2-methyl-5-trifluoromethyl-8-quinolinolate)[4-(4-cyanophe nyl)phenolate]aluminum complexes, bis(2-methyl-5-cyano-8-quinolinolate)[4-(4-cyanophenyl) phenol ate) aluminum complexes, tris(8-quinolinolate)scandium complexes, bis[8-(para-tosyl)aminoquinoline]zinc complexes and cadmium complexes, 1,2,3,4-tetraphenylcyclopentadiene, pentaphenylcyclopentadiene, poly-2,5-diheptyloxy-para-phenylenevinylene, coumarin fluorescent materials, perylene fluorescent materials, pyran fluorescent materials, anthrone fluorescent materials, porphyrin fluorescent materials, quinacridone fluorescent materials, N,N'-dialkyl-substituted quinacridone fluorescent materials, naphthalimido fluorescent materials and N,N'-diaryl-substituted pyrrolopyrrole fluorescent materials, and phosphorescent illuminants such as Ir complexes; polymer materials such as polyfluorene, polyparaphenylenevinylene, polythiophene and polyspiro; materials obtained by allowing such a polymer material to be dispersed in or copolymerized with the aforementioned low molecular material; and other preexisting luminescent materials.

Examples of the electron transport material which can be used include 2-(4-biphenylyl)-5-(4-t-butylphenyl)-1,3,4-oxadiazole, 2,5-bis(1-naphthyl)-1,3,4-oxadiazole, oxadiazole derivatives, bis(10-hydroxybenzo[h]quinolinolate) beryllium complexes, triazole compounds and the like. The organic light emitting medium layer 5 has a film thickness of equal to or less than 1000 nm, and preferably 50 to 150 nm in either case in which it is formed as a monolayer or by lamination. Particularly, the positive hole transport material of the polymer EL element has a great effect to cover the surface protrusion of the substrate and the anode layer, and film formation to give a thick film of approximately 50 to 100 nm is more preferred.

The method of forming the organic light emitting medium layer 5 which can be employed may be, depending on the material, a coating method or a printing method such as vacuum evaporation, spin coating, spray coating, nozzle coating, flexo, gravure, microgravure or intaglio offset as well as ink jet method or the like. Particularly, in this embodiment, a formation method in which the organic light emitting medium layer 5 can be patterned in the opening 3a of the insulating layer 3 is preferred. In particular, it is desired that pattern formation of luminescent materials of red (R), blue (B), green (G) can be executed in the opening 3a of the insulating layer 3 according to an arrangement enabling color display.

Subsequently, as shown in FIG. 3(d), the second electrode 6 as the cathode is formed on the top face of the insulating layer 3 and on the top face of the organic light emitting medium layer 5.

As the material of this second electrode 6, an elemental metal such as Mg, Al or Yb may be used. Alternatively, Al or Cu having excellent stability and electric conductivity may be laminated on the boundary being in contact with the organic light emitting medium layer 5 so that a compound such as Li, Li oxide or LiF is interposed to give a thickness of 1 nm. Alternatively, for the purpose of achieving both electron injection efficiency and stability, an alloy of one or more metals having a low work function such as Li, Mg, Ca, Sr, La, Ce, Er, Eu, Sc, Y or Yb with a stable metal element such as Ag, Al or Cu may be also used. Specifically, an alloy such as MgAg, AlLi or CuLi can be used. Still more, Li or Cs having a low work function can be doped in a small amount in the organic light emitting medium layer 5. Additionally, in the case of use as a translucent electrode layer for injecting the electron, Li or Ca having a low work function maybe provided to give a thin film, and thereafter, a metal complex oxide such as ITO (indium-tin complex oxide), indium-zinc complex oxide or zinc-aluminum complex oxide may be laminated, or after doping the metal having a low work function such as Li or Ca in a small amount in the organic light emitting medium layer 5, the metal oxide such as ITO may be laminated.

The method of forming the second electrode 6 which can be employed may be, depending on the material, a resistance heating vapor deposition method, an electron beam-vapor deposition method, a reactive deposition method, an ion plating method, or a sputtering method. Although the thickness of the second electrode 6 is not particularly limited, it is desirably approximately 10 nm to 1000 nm. In addition, in the case of use as a translucent electrode layer for injecting the electron, when the metal material such as Ca or Li is used, the film thickness is desirably approximately 0.1 to 10 nm.

Next, as shown in FIG. 3(e), the barrier layer 7 is laminated such that the entire face of the insulating layer 3, the first partition 4 and the organic light emitting medium layer 5, and the exposed surface of the supporting substrate 1 are covered. As this barrier layer 7, metal oxide such as silicon oxide or aluminum oxide, metal fluoride such as aluminum fluoride or magnesium fluoride, an metal nitride such as silicon nitride, aluminum nitride or carbon nitride, metal oxynitride such as silicon oxynitride, an metal carbide such as silicon carbide, or the like can be used. Particularly, it is preferred that silicon nitride, silicon oxide or silicon oxynitride that is excellent in the barrier property be used. Also, a laminated film with a film of a polymer resin such as an acrylic resin, an epoxy resin, a silicone resin or a polyester resin can be used in the barrier film 7 as needed. Furthermore, when the light is not extracted from the top side, a film of a metal such as aluminum, titanium or gold may be laminated.

The method of forming the barrier layer 7 which can be employed may be, depending on the material, a resistance heating vapor deposition method, an electron beam-vapor deposition method, a reactive deposition method, an ion plating method, a sputtering method or a CVD method. In particular, a CVD method is preferably used in light of the barrier property, and translucency. Examples of the CVD method which can be used include thermal CVD methods, plasma CVD methods, catalyst CVD methods, VUV-CVD methods and the like. Furthermore, with respect to the reactant gas in the CVD method, a gas such as $N_2$, $O_2$, $NH_3$, $H_2$ or $N_2O$ may be added as needed to an organic silicon compound such as monosilane, hexamethyl disilazane (HMDS) or tetraethoxysilane. In addition, in the above described film may be included hydrogen or carbon depending on the used reactive gas. The film thickness of the barrier layer 7 may vary depending on electrode step height of the organic EL element, partition height of the board, required barrier characteristics and the like, but may be preferably approximately 10 nm to 10000 nm, and more preferably, approximately 100 nm to 1000 nm. Furthermore, when the barrier layer 7 has a great residual stress of the film, film detachment in the organic EL element may be caused. Therefore, it is preferred that a low density film of at least ±100 MPa or less is provided.

Next, as shown in FIG. 3(f), the second partition 10 is formed on the bottom face of the sealing substrate 9, i.e., on the face opposing to the supporting substrate 1 such that it is laminated on the marginal site of the sealing substrate 9 located outside the organic EL element 101 and inside the first partition 4. This second partition 10 exhibits, as shown in FIG. 3 and FIG. 4(d), a taper shape in which the cross sectional area is decreased from the basal part joining with the sealing substrate 9 toward the tip. Furthermore, the second partition 10 is constructed to have a frame-like shape without any angulated portion when viewed from the protruding tip side, in other words, to have a shape exhibiting an endless frame-like shape with the corner portions of the second partition 10 curved in a circular arc shape, corresponding to the four corners of the sealing substrate 9 that exhibits a rectangular shape.

Subsequently, as shown in FIG. 3(g), a barrier layer 11 is laminated so that the surface of the second partition 10 and the surface region of the sealing substrate 9 where the second partition 10 is not formed are covered accordingly.

Also, a structure in which the second partitions 10 are provided in multiple rows in the direction of the plane of the sealing substrate 9 so as to correspond to the first partitions 4 is permitted.

When the first partition 4 and the second partition 10 both exhibit a taper shape as shown in FIG. 4(b), the protruding tip parts of the first partition 4 and the second partition 10 are allowed to overlap each other in the protruding direction as shown in FIG. 4(d), and the supporting substrate 1 and the sealing substrate 9 are allowed to be adjacent one another in the direction of the plane. In this state, the supporting substrate 1 and the sealing substrate 9 are attached by the adhesive layer 8. Thus, the route through which the moisture penetrated from the lateral circumferential end of the adhesive layer 8 passes to reach the organic EL element can be lengthened, whereby the organic EL panel which is not accompanied by deterioration for a long period of time can be produced even in the case of the panel having a narrow frame area.

In addition, when a photosensitive resin is used in the first and second partitions 4 and 10, even though directly superposed, formation of the route of the moisture with the partitions themselves and lengthening of the penetration route of the moisture can be avoided, therefore, the effect may be developed by covering the partitions with the barrier films 7 and 11.

Also, it is desired that as the material used in the second partition 10 and the barrier layer 11, any material may be appropriately selected on the grounds similar to those referred to with respect to the first partition 4 and the barrier layer 7. Also, to meet with the demanded moisture resistance performance, the penetration route of the moisture can be further lengthened by increasing the number of the rows of the recesses and protrusions to be superposed.

Next, as shown in FIG. 3(h), the sealing substrate 9 provided with the second partition 10 and the barrier layer 11 is laminated on the supporting substrate 1 via the adhesive layer 8.

Examples of the material of the adhesive layer 8 which can be used include thermosetting adhesive resins, photohardening adhesive resins including an epoxy resin, an acrylic resin, a silicone resin or the like, as well as thermoplastic adhesive resins including an acid-modified product of polyethylene, polypropylene or the like. Moreover, the method of forming the adhesive layer 8 which can be employed may be, depending on the material and the pattern, a coating method or a printing method such as spin coating, spray coating, flexo, gravure, microgravure or intaglio offset as well as a ink jet method, a transfer method, a laminating method or the like. Although the thickness of the adhesive layer 8 is not particularly limited, it is preferably approximately 5 to 50 μm because amount of transmission of the moisture can be minimized as the thickness is smaller, and still further, it is preferred to appropriately select the film thickness which enables the first and second partitions 4 and 10 to be uniformly attached without including any bubble therebetween.

Further, as the material of the sealing substrate 9, similarly to the aforementioned supporting substrate 1, optimal substrate may be desirably selected depending on the direction of extracting the light. Examples of the material which can be used include glass, quartz, barrier film, metal foil and the like.

Effect 1

According to the invention, it is advantageous in that a long-life organic electroluminescence panel and a method of manufacturing the same can be provided by attaching: a box-like partition in which an organic electroluminescence element is laminated inside; a box-like partition board having a box-like partition group formed with box-like partitions located on the outermost periphery without having the organic electroluminescence element formed therein; and a sealing substrate having a projecting partition including multiple projecting partitions which face the openings of the box-like partitions that construct the box-like partition group, via an adhesion layer.

Effect 2

According to the organic EL panel of the invention, a first partition is provided on the marginal site of a supporting substrate, and a second partition is provided on the marginal site of a sealing substrate, respectively, and the supporting substrate and the sealing substrate are attached via an adhesive layer, therefore, an organic EL panel, which has a long life and which enables transparent sealing accompanied by low moisture permeability, and can be used also for sealing a top emission panel, can be provided by allowing the penetration route of the moisture to be lengthened without enlarging the width of the frame.

EXAMPLE 1

Next, Example 1 according to the first embodiment of the invention will be explained with reference to FIG. 1.

Using glass as the substrate 201, an ITO film as the anode layer 202 was formed to give a thickness of 150 nm on the substrate 201 by a sputtering method (FIG. 1(a)).

Next, pattern formation was carried out using a positive photosensitive polyimide resin as the box-like partition 203 with a photolithography method (FIG. 1(b)).

Subsequently, as the polymer optical gain medium layer 204, the positive hole transport layer (20 nm) was formed with a mixture of poly(3,4-ethylenedioxythiophene) and polystyrenesulfonic acid, and a luminescent layer (100 nm) was formed with poly[2-methoxy-5-(2'-ethyl-hexyloxy)-1,4-phenylenevinylene](MEHPPV), respectively by a spin coating method (FIG. 1(c)).

Next, film formation of Ca (5 nm) was carried out as the cathode layer 205 with a vacuum evaporation method, and thereafter an ITO film (150 nm) was laminated with a sputtering method (FIG. 1(d)).

Next, as the barrier layer 206, a silicon nitride film (300 nm) was formed with a plasma CVD method so that the box-like partition 203 and the cathode layer 205 were covered thereby (FIG. 1(e)).

On the other hand, after pattern formation using a positive photosensitive polyimide resin as the projecting partition 209 on the sealing substrate 208 with a photolithography method (FIG. 1(f)), a silicon nitride film (300 nm) was formed as the barrier layer 210 on the sealing substrate 208 with the plasma CVD method so that the projecting partition 209 was covered thereby (FIG. 1(g)).

Finally, the substrate 201 and the sealing substrate 208 were attached via a thermosetting epoxy adhesive as the adhesion layer 207. In this step, superposition of recesses and protrusions of the box-like partition 203 and the projecting partition 209 were effected (FIG. 1(h)).

Thus produced organic EL panel exhibited no reduction in the luminescence area even after the storage at 60° C. under 90% RH for 3000 Hr.

EXAMPLE 2

Next, Example 2 according to the second embodiment of the invention will be explained with reference to FIG. 3.

Using glass as the supporting substrate 1, pattern formation of an ITO film (150 nm) as the first electrode 2 was carried out on the supporting substrate 1 by a sputtering method (FIG. 3(a)).

Next, pattern film formation was carried out using a positive photosensitive polyimide resin (1 µm) as the insulating layer 3 with a photolithography method (FIG. 3(b)).

Next, as the first partition 4, pattern formation using a positive photosensitive polyimide resin (5 µm) as shown in FIG. 4(b) was carried out with the photolithography method (FIG. 3(b)).

Subsequently, as the polymer optical gain medium layer 5, the positive hole transport layer (20 nm) was formed with a mixture of poly(3,4-ethylenedioxythiophene) and polystyrenesulfonic acid, and a luminescent layer (100 nm) was formed with poly[2-methoxy-5-(2'-ethyl-hexyloxy)-1,4-phenylenevinylene](MEHPPV), respectively by a flexography method (FIG. 3(c)).

Next, film formation of Ca (5 nm) was carried out as the second electrode 6 with a vacuum evaporation method, and thereafter an ITO film (150 nm) was laminated with a sputtering method (FIG. 3(d)).

Next, as the barrier layer 7, a silicon nitride film (1000 nm) was formed with a plasma CVD method so that the surface of the insulating layer 3, first partition 4, polymer optical gain medium layer 5 and second electrode 6 is covered thereby (FIG. 3(e)).

On the other hand, after pattern formation of a positive photosensitive polyimide resin (5 µm) as the frame-like partition 10 on the sealing substrate 9 with a photolithography method (FIG. 3(f)), a silicon nitride film (1000 nm) was formed as the barrier layer 11 on the sealing substrate 9 with the plasma CVD method so that not only the second partition 10 but the sealing substrate 9 is covered thereby (FIG. 3(g)).

Finally, the supporting substrate 1 and the sealing substrate 9 were attached via a thermosetting epoxy adhesive as the adhesion layer 8. In this step, superposition of the first and the second partitions 4 and 10 were effected as shown in FIG. 4(e).

Thus produced organic EL panel exhibited no reduction in the luminescence area even after the storage at 60° C. under 90% RH for 3000 Hr.

Next, Reference Examples which are different from the Examples of the first embodiment and the second embodiment will be explained with reference to the drawings.

REFERENCE EXAMPLE 1

In the organic EL element described in Example 1, the sealing substrate 208 was attached to the substrate 201 without forming the projecting partition 209 and the barrier layer 210.

As a result of storage of thus produced organic EL panel at 60° C. under 90% RH for 3000 Hr, the organic EL element was deteriorated due to the moisture penetrated from the end, whereby the luminescence area was reduced to 50% or less.

REFERENCE EXAMPLE 2

In the organic EL element described in Reference Example 1, the sealing substrate 208 was attached without laminating the barrier layer 206 on the cathode layer 205.

As a result of storage of thus produced organic EL panel at 60° C. under 90% RH for 3000 Hr, the organic EL element was deteriorated due to the moisture penetrated from the end, thereby resulting in failure in the luminescence.

REFERENCE EXAMPLE 3

In the organic EL element described in Example 2, the sealing substrate 8 was attached to the supporting substrate 1 without forming the barrier films 7 and 11 on the first and second partitions 4 and 10.

As a result of storage of thus produced organic EL panel at 60° C. under 90% RH for 3000 Hr, the organic EL element was deteriorated due to the moisture penetrated from the end, thereby resulting in failure in the luminescence.

REFERENCE EXAMPLE 4

In the organic EL element described in Example 2, the sealing substrate 8 was attached without laminating the frame-like partition 10 and the barrier layer 11.

As a result of storage of thus produced organic EL panel at 60° C. under 90% RH for 3000 Hr, the organic EL element was deteriorated due to the moisture penetrated from the end, whereby the luminescence area was reduced to 50% or less.

What is claimed is:

1. An organic electroluminescence panel, comprising:
multiple box-like partitions having an insulation property, and organic electroluminescence elements formed by laminating an anode layer, an organic light emitting medium layer and a cathode layer in at least the box-like partitions on one face of a substrate, wherein
the organic electroluminescence element is not formed in at least the box-like partition located at the outermost periphery among the multiple box-like partitions, and the box-like partitions, which are located at the outermost periphery, without having the organic electroluminescence element formed therein construct an outermost peripheral box-like partition group, and wherein a first barrier layer is laminated on the one face of the substrate so as to cover an entire surface of the box-like partitions having the organic electroluminescence element formed therein, and an entire surface of the box-like partitions that construct the outermost peripheral box-like partition group, wherein
a sealing substrate is laminated via an adhesive layer on the box-like partitions having the organic electroluminescence element formed therein, and the box-like partitions that construct the outermost peripheral box-like partition group, and wherein
one face of the sealing substrate has a projecting partition group opposing to the one face of the substrate on which the organic electroluminescence element is formed, and wherein
a second barrier layer is laminated on the one face of the sealing substrate so as to cover an entire surface of the projecting partition group and a surface of the one face of the sealing substrate, and the adhesive layer is formed between the first barrier layer laminated on the one face of the substrate and the second barrier layer laminated on the one face of the sealing substrate.

2. The organic electroluminescence panel according to claim 1 wherein the projecting partition group is constructed with multiple projecting partitions formed at substantially the same position with the openings of the box-like partitions that construct the outermost peripheral box-like partition group, and each of the projecting partitions is formed in a size smaller than the openings of the box-like partitions that construct the outermost peripheral box-like partition group.

3. An organic electroluminescence panel, comprising:
a supporting substrate;
an organic electroluminescence element including a first electrode formed on one face of the supporting substrate to correspond to display pixels, an organic light emitting medium layer laminated on the first electrode, and a second electrode laminated on the organic light emitting medium layer;
a sealing substrate covering the one face of the supporting substrate including the organic electroluminescence element via an adhesive layer to permit sealing;
at least one first partition protruding toward the sealing substrate,
wherein the at least one first partition is formed on the one face of the supporting substrate so as to surround the circumference of the organic electroluminescence element, and
wherein an entire surface of the organic electroluminescence element and an entire surface of the first partition are covered by a first barrier layer comprising an inorganic compound; and
at least one second partition protruding toward the supporting substrate,
wherein the at least one second partition is formed on one face of the sealing substrate opposing to the one face of the supporting substrate so as to surround the circumference of the organic electroluminescence element, and
wherein an entire surface of the second partition and a surface of the one face of the sealing substrate are covered by a second barrier layer comprising an inorganic compound, and
wherein the adhesive layer is formed between the first barrier layer covering the organic electroluminescence element and the first partition, and the second barrier layer covering the second partition and the sealing substrate.

4. The organic electroluminescence panel according to claim 3 wherein the first partition is formed at a marginal site of the one face of the supporting substrate.

5. The organic electroluminescence panel according to claim 3 wherein the second partition is formed at a marginal site of the face of the sealing substrate opposing to the one face of the supporting substrate.

6. The organic electroluminescence panel according to claim 3 wherein either one of the first and second partitions is located on an external side from the other partition.

7. The organic electroluminescence panel according to claim 3 wherein the first partition and the second partition are adjacent to one another.

8. The organic electroluminescence panel according to claim 3 wherein the first and the second partitions exhibit a taper shape in which the cross sectional area is decreased from the basal part joining with the supporting substrate or the sealing substrate, toward the tip.

9. The organic electroluminescence panel according to claim 3 wherein a recessed part is formed over the entire length of a protruding tip face of either one of the first or second partition, and a protruding part engaged with the recessed part is formed on a protruding tip face of the other partition.

10. The organic electroluminescence panel according to claim 3 wherein the first electrode and the organic light emitting medium layer are surrounded by an insulating layer formed on the one face of the supporting substrate, and the second electrode is laminated on a top face of the organic light emitting medium layer and a top face of the insulating layer.

11. The organic electroluminescence panel according to claim 10 wherein the size of the protruding height of the insulating layer from the one face of the supporting substrate is smaller than the size of the protruding height of the first partition from the one face of the supporting substrate.

12. An organic electroluminescence panel, comprising:
a supporting substrate;
an organic electroluminescence element on one face of the supporting electrode, the organic electroluminescence element including a first electrode formed so as to correspond to a display pixel, an organic light emitting medium layer laminated on the first electrode, and a second electrode laminated on the organic light emitting medium layer;
a sealing substrate covering the one face of the supporting substrate via an adhesive layer to permit sealing;
at least one first partition protruding toward one face of the sealing substrate and being formed on the one face of the supporting substrate so as to surround the circumference of the organic electroluminescence element; and
at least one second partition protruding toward the one face of the supporting substrate and being formed on the one face of the sealing substrate so as to surround the circumference of the organic electroluminescence element, and wherein a surface of the second partition is covered by a first barrier layer comprising an inorganic compound, and wherein the surface of the organic electroluminescence element and the surface of the first partition are covered by a second barrier layer comprising an inorganic compound, and the adhesive layer is between the first barrier layer and the second barrier layer
a recessed part is formed over an entire length of a protruding tip face of either one of the first or second partition, and a protruding part engaged with the recessed part is formed on a protruding tip face of the other partition.

13. The organic electroluminescence panel according to claim 12 wherein the first partition is formed at a marginal site of the one face of the supporting substrate.

14. The organic electroluminescence panel according to claim 12 wherein the second partition is formed at a marginal site of the face of the sealing substrate opposing to the one face of the supporting substrate.

15. The organic electroluminescence panel according to claim 12 wherein either one of the first and second partitions is located on an external side from the other partition.

16. The organic electroluminescence panel according to claim 12 wherein the first partition and the second partition are adjacent to one another.

17. The organic electroluminescence panel according to claim 12 wherein the first and the second partitions exhibit a taper shape in which the cross sectional area is decreased from the basal part joining with the supporting substrate or the sealing substrate, toward the tip.

18. The organic electroluminescence panel according to claim 12 wherein the first electrode and the organic light emitting medium layer are surrounded by an insulating layer formed on the one face of the supporting substrate, and the second electrode is laminated on a top face of the organic light emitting medium layer and a top face of the insulating layer.

19. The organic electroluminescence panel according to claim 18 wherein the size of the protruding height of the insulating layer from the one face of the supporting substrate is smaller than the size of the protruding height of the first partition from the one face of the supporting substrate.

* * * * *